(12) United States Patent
Wei et al.

(10) Patent No.: US 8,114,746 B2
(45) Date of Patent: Feb. 14, 2012

(54) METHOD FOR FORMING DOUBLE GATE AND TRI-GATE TRANSISTORS ON A BULK SUBSTRATE

(75) Inventors: Andy Wei, Dresden (DE); Robert Mulfinger, Dresden (DE); Thilo Scheiper, Dresden (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 236 days.

(21) Appl. No.: 12/473,610

(22) Filed: May 28, 2009

(65) Prior Publication Data

US 2009/0321836 A1    Dec. 31, 2009

(30) Foreign Application Priority Data

Jun. 30, 2008 (DE) .................. 10 2008 030 864

(51) Int. Cl.
*H01L 21/336* (2006.01)
(52) U.S. Cl. ................ 438/296; 257/E21.628
(58) Field of Classification Search .................. 438/197, 438/296, 294; 257/E21.628
See application file for complete search history.

(56) References Cited

U.S. PATENT DOCUMENTS

| | | | | |
|---|---|---|---|---|
| 6,951,784 | B1 | 10/2005 | Anderson et al. | 438/157 |
| 7,101,763 | B1* | 9/2006 | Anderson et al. | 438/285 |
| 7,241,653 | B2 | 7/2007 | Hareland et al. | 438/199 |
| 7,560,785 | B2* | 7/2009 | Yu et al. | 257/401 |
| 7,605,028 | B2* | 10/2009 | Mouli | 438/157 |
| 7,667,248 | B2* | 2/2010 | Booth et al. | 257/288 |
| 7,863,122 | B2* | 1/2011 | Booth et al. | 438/197 |
| 2004/0256683 | A1 | 12/2004 | Lee et al. | 257/412 |
| 2005/0226047 | A1 | 10/2005 | Hieda et al. | 365/185.14 |
| 2006/0043616 | A1 | 3/2006 | Anderson et al. | 257/900 |
| 2006/0099749 | A1 | 5/2006 | Yagishita | 438/183 |
| 2007/0004117 | A1 | 1/2007 | Yagishita | 438/197 |
| 2007/0045736 | A1 | 3/2007 | Yagishita | 257/347 |
| 2007/0063276 | A1 | 3/2007 | Beintner et al. | 257/347 |
| 2007/0069292 | A1 | 3/2007 | Yamada | 257/347 |
| 2007/0069293 | A1 | 3/2007 | Kavalieros et al. | 257/350 |

FOREIGN PATENT DOCUMENTS

JP    2004-221510    7/2004

OTHER PUBLICATIONS

Choi et al., "A Spacer Patterning Technology for Nanoscale CMOS," *IEEE Transactions on Electron Devices*, 49:436-41, Mar. 2002.
Colinge, "Novel Gate Concepts for MOS Devices," *Solid-State Device Research Conference*, pp. 45-49, Sep. 2004.

(Continued)

*Primary Examiner* — Evan Pert
(74) *Attorney, Agent, or Firm* — Williams, Morgan & Amerson, P.C.

(57) ABSTRACT

Three-dimensional transistor structures such as FinFETS and tri-gate transistors may be formed on the basis of an enhanced masking regime, thereby enabling the formation of drain and source areas, the fins and isolation structures in a self-aligned manner within a bulk semiconductor material. After defining the basic fin structures, highly efficient manufacturing techniques of planar transistor configurations may be used, thereby even further enhancing overall performance of the three-dimensional transistor configurations.

28 Claims, 14 Drawing Sheets

OTHER PUBLICATIONS

Okano et al., "Process Integration Technology and Device Characteristics of CMOS FinFET on Bulk Silicon Substrate with sub-10 nm Fin Width and 20 nm Gate Length," *IEDM Technical Digest*, pp. 721-724, Dec. 2005.

Translation of Official Communication from German Patent Office for German Patent Application No. 10 2008 030 864.1 dated Jul. 30, 2009.

* cited by examiner

METHOD FOR FORMING DOUBLE GATE AND TRI-GATE TRANSISTORS ON A BULK SUBSTRATE

BACKGROUND OF THE INVENTION

1. Field of the Invention

Generally, the present disclosure relates to the fabrication of highly sophisticated integrated circuits including highly scaled transistor elements having a double gate (FinFET) or triple gate architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET).

It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Although significant advantages may be obtained with respect to performance and controllability of sophisticated planar transistor architectures on the basis of the above-specified strategies, in view of further device scaling, new transistor configurations have been proposed in which a "three-dimensional" architecture may be provided in an attempt to obtain a desired channel width while at the same time maintaining good controllability of the current flow through the channel region. To this end, so-called FinFETS have been proposed in which a thin sliver or fin of silicon may be formed in a thin active layer of a silicon-on-insulator (SOI) substrate, wherein, on both sidewalls, a gate dielectric material and a gate electrode material may be provided, thereby realizing a double gate transistor, the channel region of which may be fully depleted. Typically, in sophisticated applications, the width of the silicon fin is on the order of 10 nm and the height thereof is on the order of 30 nm. In a modified version of the basic double gate transistor architecture, a gate dielectric material and a gate electrode may also be formed on a top surface of the fin, thereby realizing a tri-gate transistor architecture. With reference to FIGS. 1a-1b, the basic configuration of conventional FinFETS and characteristics associated with the conventional manufacturing techniques may be described in more detail.

FIG. 1a schematically illustrates a perspective view of a semiconductor device 100 which comprises a conventional double gate or fin field effect transistor (FinFET) 150. As illustrated, the device 100 may comprise a substrate 101, such as a silicon substrate, having formed thereon a buried insulating layer 102, for instance in the form of a silicon dioxide material. Moreover, in FIG. 1a, a fin 110 is illustrated which represents the remaining portion of a silicon layer (not shown) formed on the buried oxide layer 102, thereby defining an SOI configuration. The fin 110 may comprise a portion of drain and source regions 111 and also a channel region (not shown), which may be covered by gate electrode structures 120A, 120B which may be formed on respective sidewalls 110A, 110B of the fin 110 and may comprise an appropriate gate dielectric material, such as silicon dioxide in combination with an electrode material, such as polycrystalline silicon. A top surface of the fin 110 may be covered by a cap layer 112, which may be comprised of silicon nitride and the like. As illustrated, both gate electrode structures 120A, 120B may be connected by electrode material formed on the cap layer 112. The fin 110 may have a height 111H, a width 111W and a length 111L corresponding to the overall device requirements, wherein an effective channel length within the fin 110 may be substantially determined by an extension of the gate electrode structures 120A, 120B along the length direction defined by the fin 110.

Typically, the semiconductor device 100 comprising the FinFET 150 is formed by patterning the active silicon layer formed on the buried insulating layer 102 and thereafter performing appropriately designed manufacturing processes for forming the gate electrode structures 120A, 120B, defining appropriate dopant profiles for the drain and source regions 111 and the channel region, followed by forming an appropriate contact layer.

During operation, a current flow may be established from drain to source by applying an appropriate supply voltage and also applying an appropriate control voltage to the gate electrodes 120A, 120B. Consequently, the channel region, i.e., the portion of the fin 110 enclosed by the gate electrode structures 120A, 120B, may be controlled from both sides of the fin 110, thereby obtaining a fully depleted configuration, which is expected to provide enhanced channel control.

FIG. 1b schematically illustrates a top view of the device 100, in which three FET transistors 150 are provided. As illustrated, the drain regions of the transistors 150 and the source regions may be connected by an epitaxially re-grown silicon material, thereby forming a silicon layer 103 at the drain side and the source side, respectively. Typically, the silicon material at the drain side and the source side may be formed by selective epitaxial growth techniques, thereby also requiring spacer elements 104 to provide the required offset to the gate electrode material of the various double gate structures 120A, 120B. Although the semiconductor layers 103 may be provided at the drain side and the source side, acting as drain and source regions of the individual transistor cells 150, nevertheless, a portion of the drain and source regions, such as the regions 111 (see FIG. 1a), may have to be provided due to the presence of the spacer elements 104, thereby creating a moderately high series resistance due to the limited amount of silicon volume in the fins and due to dopant out-diffusion into the buried oxide. Consequently, although these transistors offer superior short channel behavior due to the full depletion of the channel and due to control from two or three gates, when the cap layer 112 (see FIG. 1a) is omitted and replaced by a gate dielectric material, drive current is limited by the high series resistance of the drain and source regions 111 in the fins 110 within each individual transistor 150, so that currently this technology may not be competitive to standard planar transistor architecture that may be provided in a bulk configuration or partially depleted SOI configuration.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques for forming the same, in which a double gate or tri-gate transistor may be formed on a silicon bulk substrate by using well-established conventional "two-dimensional" process techniques after forming the corresponding fins of the transistor cells in the silicon material. Consequently, an increased silicon volume may be provided in the fins, while well-established two-dimensional process techniques may be employed after forming the fins, thereby providing efficient means for reducing the overall series resistance while at the same time providing a highly efficient overall manufacturing flow starting from a significantly less cost-intensive substrate material.

One illustrative method disclosed herein comprises forming a layer stack above a semiconductor layer of a semiconductor device, wherein the layer stack comprises an etch stop layer formed above the semiconductor layer and a first mask layer formed above the etch stop layer. The method further comprises patterning the first mask layer to obtain a mask feature and forming a spacer element on sidewalls of the mask feature. Moreover, the mask feature is selectively removed to the sidewall spacer element and a second mask layer is provided having a first opening exposing a portion of the sidewall spacer element so as to define a channel area and drain and source areas. The method further comprises forming trenches in the semiconductor layer by using the sidewall spacer element and the second mask layer as an etch mask to form a fin in the semiconductor layer, wherein the fin corresponds to the channel area. Furthermore, a gate electrode structure is formed at least on sidewalls of the fin and drain and source regions are formed in the drain and source areas, wherein the drain and source regions connect to the fin.

A further illustrative method disclosed herein relates to forming a transistor. The method comprises forming a mask feature above a semiconductor layer, wherein the mask feature defines a lateral dimension of a fin to be formed in the semiconductor layer. The method additionally comprises forming a mask layer having a first opening and a second opening, wherein the first opening defines a length of the fin and the second opening defines a lateral size and position of an isolation structure. Furthermore, the fin and an isolation trench are formed in the semiconductor layer in a common etch process by using the mask layer as an etch mask. The method further comprises forming a first gate electrode structure on a portion of a first sidewall of the fin and forming a second gate electrode structure on a portion of a second sidewall of the fin. Finally, the method comprises forming drain and source regions in the semiconductor layer adjacent to end portions of the fin.

One illustrative semiconductor device disclosed herein comprises a semiconductor layer and a first recess and a second recess formed in the semiconductor layer, wherein the first and second recesses have a common boundary so as to define a fin, a height of which is less than a thickness of the semiconductor layer. The semiconductor device further comprises a first gate electrode structure formed on a first sidewall of the fin and a second gate electrode structure formed on a second sidewall of the fin. Finally, the semiconductor device comprises drain and source regions connected to the fin.

BRIEF DESCRIPTION OF THE DRAWINGS

The disclosure may be understood by reference to the following description taken in conjunction with the accompanying drawings, in which like reference numerals identify like elements, and in which.

Figure 1A:
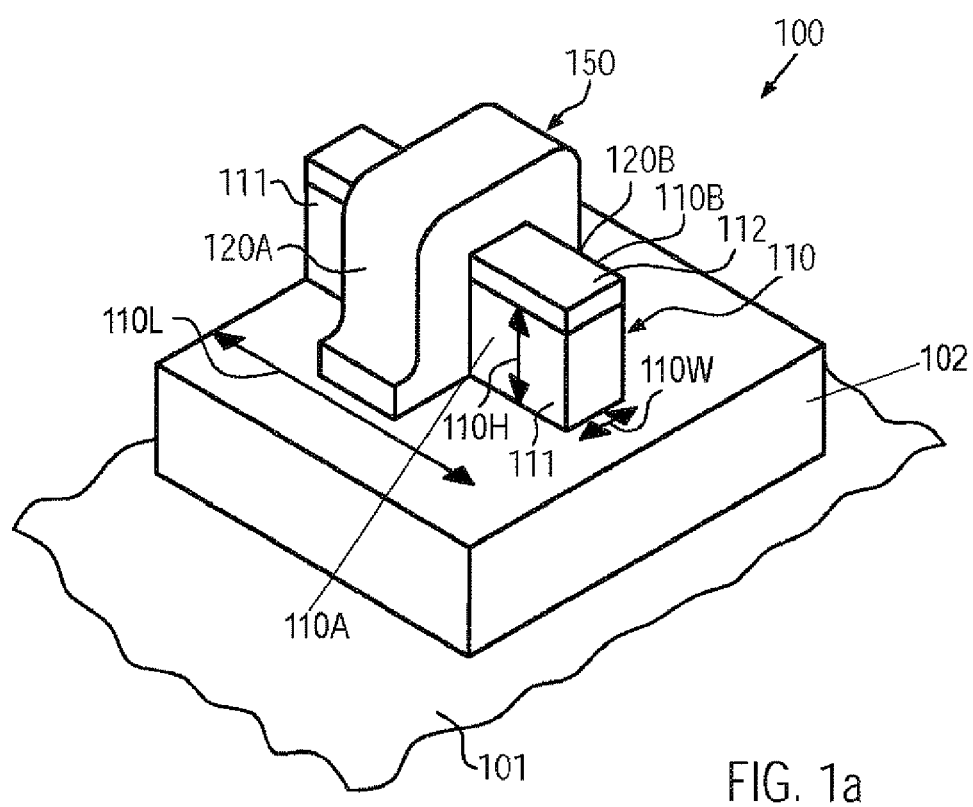
FIGS. 1a-1b schematically illustrate a perspective view and a top view, respectively, of a semiconductor device comprising a conventional FinFET transistor cell based on an SOI substrate.
Figure 1B:
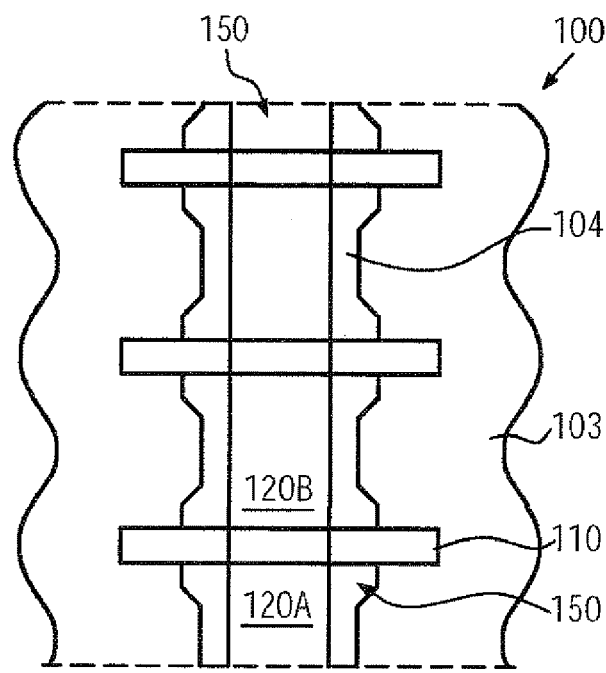

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure relates to methods and semiconductor devices in which double gate transistors, which may also be referred to as FinFETS, or tri-gate transistors may be formed on a bulk substrate. That is, the fin elements for accommodating the channel regions of the transistors may be formed within a semiconductor layer, wherein a height of the fins is less than a thickness of the corresponding semiconductor layer. Thus, in this sense, any transistor configuration in which additional semiconductor volume, such as silicon volume, may be provided below the actual fin elements may be considered as a bulk configuration, irrespective of whether any further buried insulating layer may be provided in the "depth" of the bulk semiconductor layer. After completing the basic structure for the fins and the two or three gate electrode structures in combination with the low resistance drain and source areas, which may be accomplished, in some illustrative embodiments, in a self-aligned manufacturing sequence, well-established planar process techniques may be used for adjusting the drain and source dopant profile, enhancing overall series resistance of the channel region, for instance by applying strain-inducing mechanisms and the like. Consequently, the advantages of a three-dimensional transistor configuration may be maintained while significantly reducing drive current limitations of conventional Fin- FETS or tri-gate transistors, while at the same time providing a highly efficient overall manufacturing process flow.

Figure 2A:
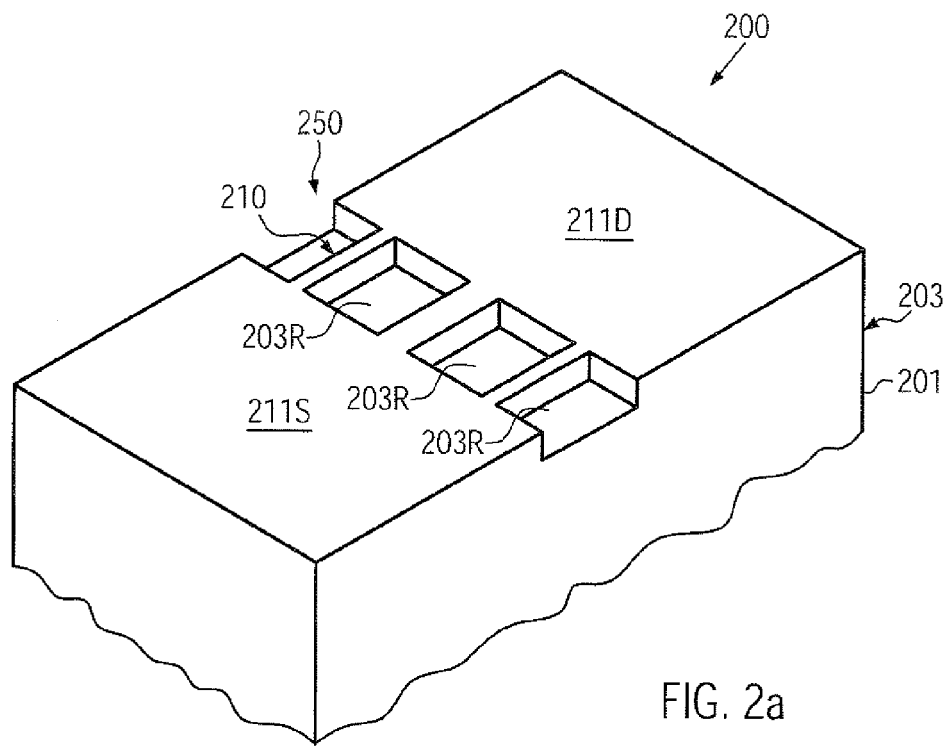
FIG. 2a schematically illustrates a perspective view of a "three-dimensional" transistor configuration including a fin formed in a bulk substrate, wherein the drain and source regions and the fin may be formed in a common manufacturing process by providing a self-aligned process technique with respect to the gate electrode structures, according to illustrative embodiments.

FIG. 2a schematically illustrates a perspective view of a semiconductor device 200, which may comprise a substrate 201, such as a silicon substrate or any other appropriate carrier material for forming thereon a semiconductor layer 203, which may represent a silicon layer, possibly comprising additional components, such as germanium, carbon and the like, while in other cases any other appropriate semiconductor compound may be used. In one illustrative embodiment, the semiconductor layer 203 may represent a silicon-based material, which may represent a portion of a substantially crystalline material of the substrate 201, at least locally in device areas, in which a plurality of double gate or tri-gate transistors 250 are to be formed. It should be appreciated that the semiconductor device 200 may have an SOI configuration in other device areas, depending on the overall requirements. As illustrated, the one or more transistors 250 may have a common drain region 211D and a common source region 211S formed in the semiconductor layer 203, wherein the drain and source regions 211D, 211S may be connected by respective fins 210, each of which may represent a channel region of one of the transistors 250. Consequently, the fins 210 may also be formed in the semiconductor layer 203 by providing respective recesses 203R between adjacent fins 210, thereby defining the three-dimensional dimensions of the fins 210, such as a height, a width and a length thereof. Furthermore, the recesses 203R may also define the position of respective gate electrode structures to be formed at least on sidewalls of the fins 210 and, in some illustrative embodiments, also on a top surface thereof. As will be explained in more detail later on, the drain and source regions 211D, 211S, the fins 210 and respective electrode structures in the recesses 203R and above the fins 210 may be provided in a self-aligned manner together with respective isolation structures (not shown), which may enclose the one or more transistors 250 and also provide for insulation of the recesses with respect to a gate electrode material to be formed within the recesses, as will be described later on in more detail.

Figure 2B:
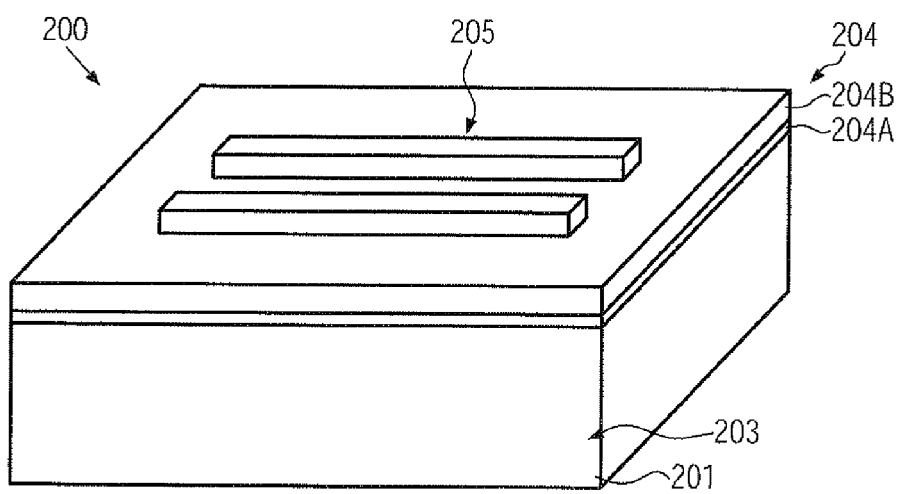
FIGS. 2b-2i schematically illustrate perspective views of the semiconductor device including a plurality of FinFET transistor cells during various manufacturing stages for forming fins in a bulk semiconductor layer, according to illustrative embodiments.

FIG. 2b schematically illustrates the semiconductor device 200 at an early manufacturing stage. As illustrated, a layer stack 204 may be formed on the semiconductor layer 203 and may be comprised of an etch stop layer 204A, formed on the semiconductor layer 203, and a mask layer 204B formed on the etch stop layer 204A. For instance, the etch stop layer 204A may be provided in the form of a silicon dioxide material, while the mask layer 204B may be comprised of silicon. Furthermore, resist features 205 may be provided in the form of line-like features with a width and spacing in accordance with the technology standard under consideration. That is, the width and the spacing defined by the resist features 205 may represent a critical dimension of the corresponding technology standard, which may be consistently and reproducibly patterned on the basis of the corresponding lithography techniques.

The semiconductor device 200 as shown in FIG. 2b may be formed on the basis of the following processes. The substrate 201 comprising the semiconductor layer 203 may be provided, for instance, in the form of a silicon bulk substrate, while, in other cases, a different configuration for the substrate 201 and the layer 203 may be employed, as previously explained. Thereafter, the etch stop layer 204A may be formed, for instance, by growing an oxide layer on the basis of well-established techniques with an appropriate thickness, such as approximately 2-5 nm. Thereafter, the mask layer 204B, for instance in the form of a silicon material, may be deposited with a thickness of, for instance, approximately 60-80 nm, using well-established plasma assisted or thermally activated deposition recipes. By using silicon dioxide material and silicon in the layer stack 204, well-established recipes for patterning the stack 204 may be used when forming an appropriate hard mask for providing mask features for the fins to be formed in the semiconductor layer 203. It should be appreciated that other materials may be used for the layer stack 204, as long as the required etch stop capabilities during the further processes may be obtained. The etch stop layer 204A, when comprised of silicon dioxide, may be provided with an appropriate thickness so as to avoid a lateral etching upon contact with wet chemical etch chemistries, such as hydrofluoric acid (HF), when the layer 204A is capped, for instance, by the mask layer 204B. In this manner, any undesired under-etching of respective features during a respective wet chemical etch process may be suppressed. On the other hand, the mask layer 204B may be provided with a thickness that is equal to or greater than a desired final width of the fins 210, since these fins may be formed on the basis of sidewall spacer elements to be formed in a conformal manner on sidewalls of mask features to be formed from the mask layer 204B in a later manufacturing stage. Furthermore, after the provision of the layer stack 204, the resist features 205 may be provided on the basis of well-established lithography techniques.

Figure 2C:
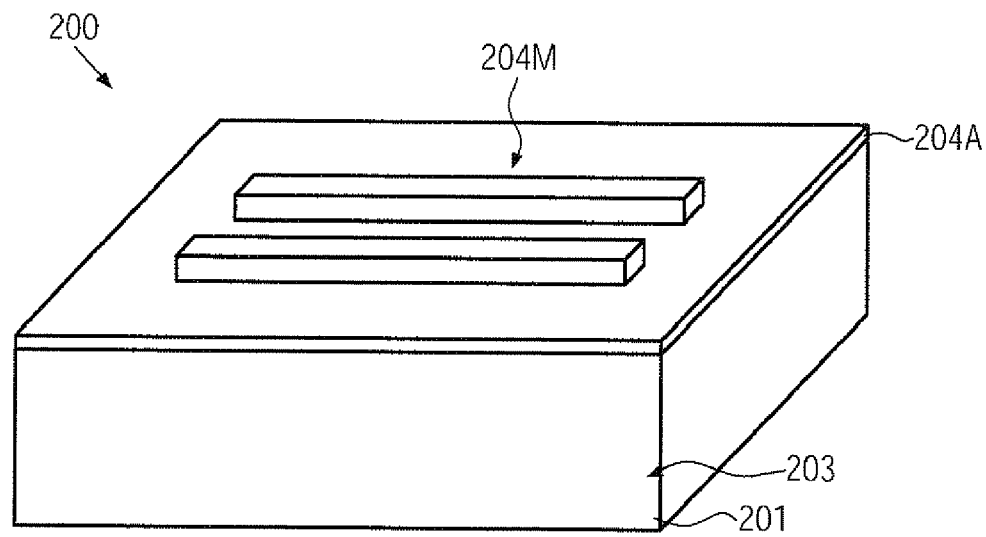

FIG. 2c schematically illustrates the semiconductor device 200 with mask features 204M, which may substantially correspond to the resist features 205 (FIG. 2b) with respect to their lateral dimensions, while a height of the features 204M is defined by the initial thickness of the mask layer 204B (FIG. 2b). The features 204M may be formed on the basis of an appropriately designed etch process, wherein, in some illustrative embodiments, well-established etch recipes for patterning polycrystalline gate electrodes may be used as a basis when the layers 204B, 204A are comprised of silicon and silicon dioxide, respectively. Thereafter, the resist features 205 may be removed on the basis of any appropriate technique.

Figure 2D:
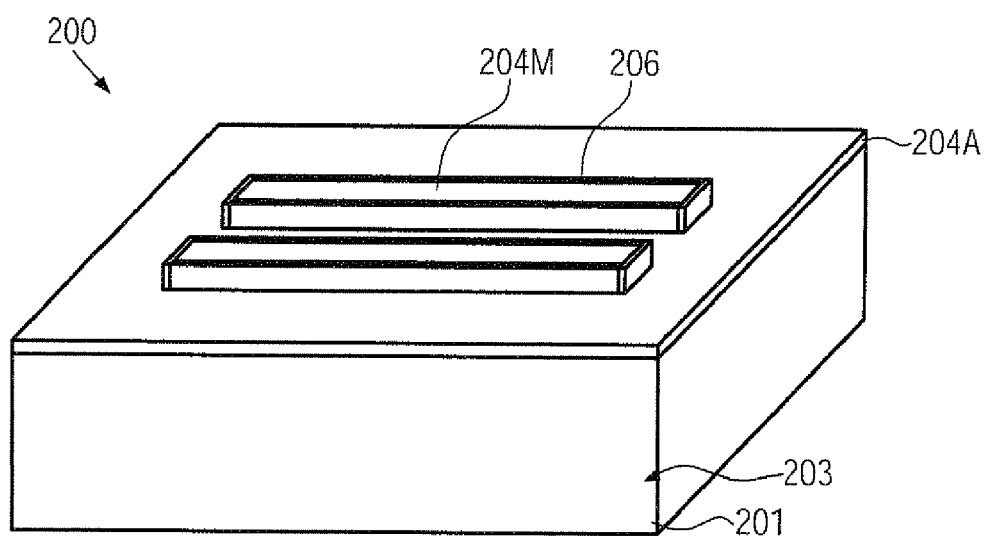

FIG. 2d schematically illustrates the device 200 with sidewall spacer elements 206 formed on exposed sidewall portions of the mask features 204M. For instance, the spacer elements 206 may be comprised of silicon nitride, while other appropriate materials, such as silicon carbide, nitrogen-containing silicon carbide and the like, may be used as long as the desired degree of etch selectivity and compatibility with the subsequent processes may be ensured. The spacers 206 may be formed by depositing a silicon nitride material, for instance by thermally activated chemical vapor deposition (CVD) techniques, while controlling the deposition thickness, which may substantially correspond to a desired final width of the fins to be formed on the basis of the spacer elements 206. After the deposition of the spacer material, an anisotropic etch process may be performed, which may be selective with respect to the etch stop layer 204A. In some illustrative embodiments, an etch recipe may be used, which may be selective with respect to the mask features 204M, which may be accomplished by using well-known process techniques, while in other cases an etch recipe that is non-selective to the spacer material and the mask feature 204M may also be used as long as a high degree of etch stop capability of the layer 204A is maintained.

Figure 2E:
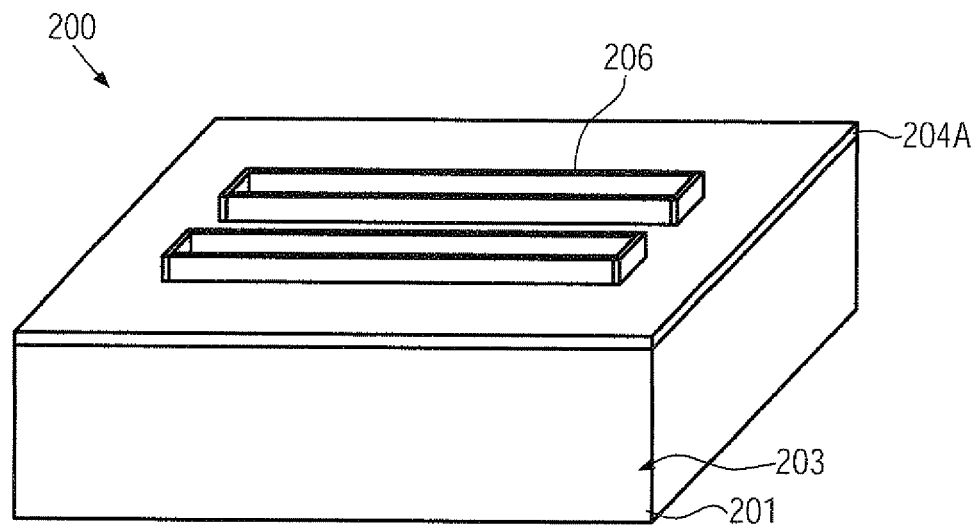

FIG. 2e schematically illustrates the device 200 after a selective removal of the mask features 204M, which may be accomplished by any appropriate selective etch chemistry that may provide a sufficiently high selectivity with respect to the etch stop layer 204A and the spacer element 206. For example, a plurality of plasma assisted etch recipes on the basis of hydrogen bromide (HBr) may be used, while in other cases wet chemical techniques may be employed, for instance on the basis of TMAH (tetra methyl ammonium hydroxide) when silicon dioxide, silicon nitride and silicon may be used as materials for the etch stop layer 204A, the spacers 206 and the mask features 204M. TMAH is highly selective to oxide (2000-3000:1) and nitride (approximately 10000:1), thereby efficiently removing the exposed mask features 204M while not unduly consuming material of the spacers 206, which represent hard mask elements for forming the fins in the semiconductor layer 203. A wet chemical etch process, for instance on the basis of TMAH, may also be combined with a plasma assisted process and may be combined, for instance, for removing a native oxide that may be formed on the exposed surface portion of the mask features 204M.

Figure 2F:
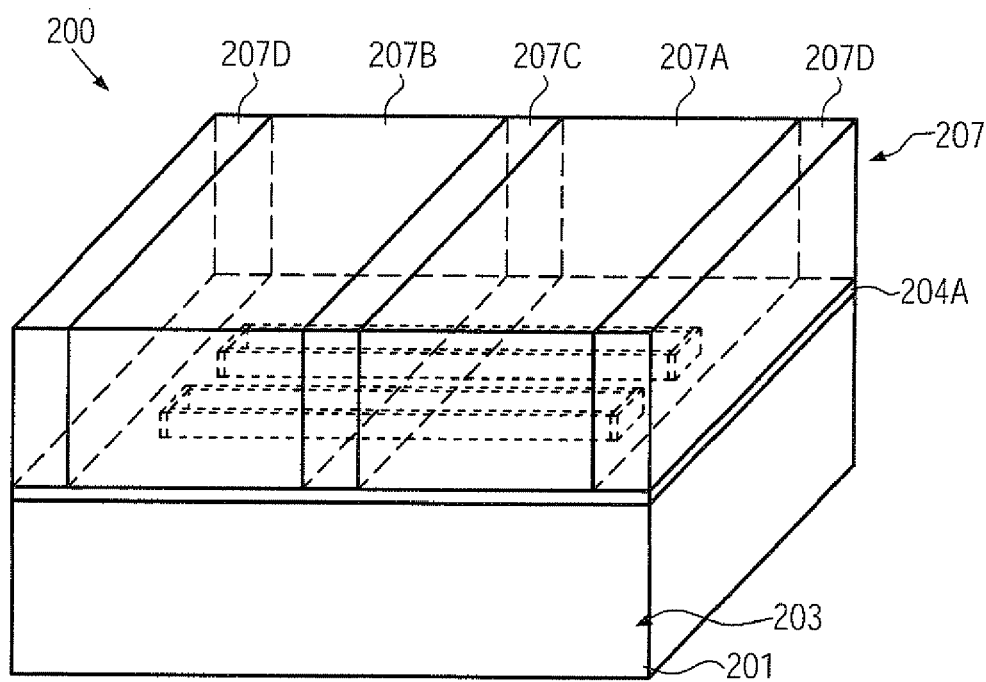

FIG. 2f schematically illustrates the semiconductor device 200 in a further advanced manufacturing stage in forming a further mask for forming the fin in the semiconductor layer 203 at a channel area, while at the same time defining respective drain and source areas (see FIG. 2a). As illustrated, a mask layer 207 may comprise masking elements 207A, 207B which may correspond to drain and source areas, such as the drain and source regions 211D, 211S as illustrated in FIG. 2a. Furthermore, a masking element 207C may represent a channel area and a region in which gate electrode structures are to be formed for a double gate or tri-gate transistor, while mask features 207D may represent respective areas in which isolation trenches are to be formed in the semiconductor layer 203. The mask features 207A, 207B on the one hand and the features 207C, 207D on the other hand may be comprised of different materials so as to enable a selective removal of the mask elements 207C, 207D in a later manufacturing stage. For example, the features 207A, 207B may be comprised of silicon nitride while the features 207C, 207D may be comprised of a silicon material.

The mask layer 207 may be formed by depositing a layer of an appropriate material, such as silicon, the thickness of which may be selected to be greater or equal to the final gate height that is necessary to block source/drain implantation species from the top of the fins still to be formed within the semiconductor layer 203. For example, the thickness of the mask layer 207 may be approximately 70-90 nm. Thereafter, the layer 207 may be patterned by a lithography process in which the position of the mask features 207C, 207D may be concurrently defined, thereby also providing the lateral size and position of the drain and source areas, the gate electrodes and the isolation structures in a self-aligned manner. After performing the corresponding lithography process, the mask layer 207 may be anisotropically etched using well-established etch recipes, for instance for selectively etching silicon with respect to silicon dioxide, as previously explained. Thereafter, an appropriate fill material for forming the mask elements 207A, 207B may be deposited, for instance in the form of silicon nitride, wherein a corresponding resulting surface topography may be planarized by performing a planarization process, such as chemical mechanical polishing (CMP), wherein the remaining mask features 207C, 207D may be used as a CMP stop layer for providing enhanced control of the planarization process. Next, the mask elements 207C, 207D corresponding to the gate electrodes and channel areas and the isolation structures may be selectively removed, for instance by using similar process techniques as previously described. For example, TMAH may be used in order to efficiently remove silicon selectively with respect to nitride and oxide.

Figure 2G:
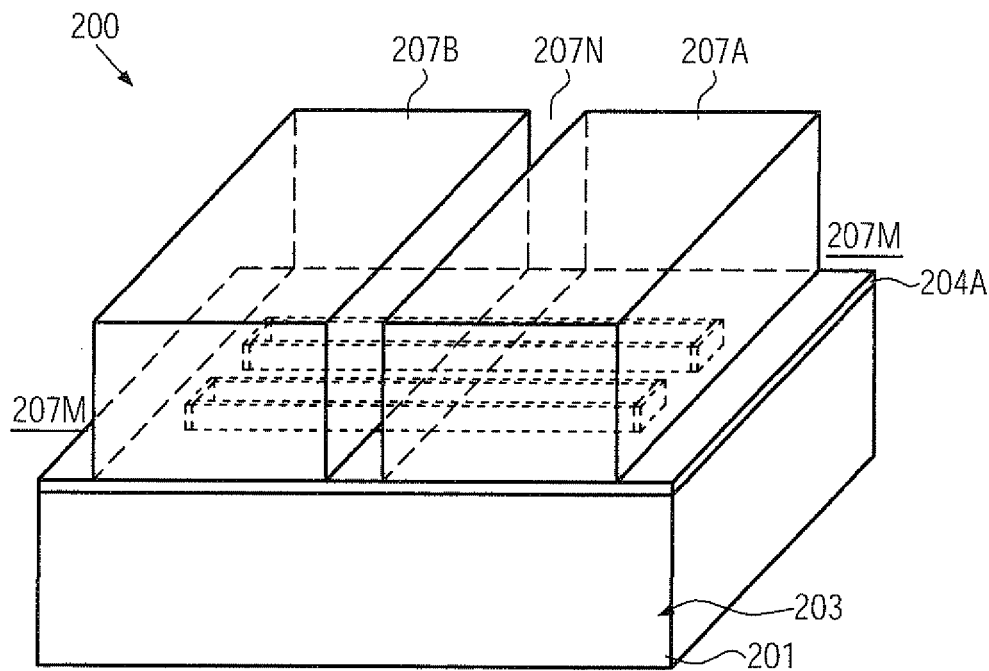

FIG. 2g schematically illustrates the semiconductor device 200 after the end of the above-described process sequence. Thus, respective openings 207N, 207M are formed in the mask layer 207, thereby defining channel areas, i.e., areas in which the fins are to be formed, and also isolation trench areas, while the remaining mask elements 207A, 207B may represent the drain and source areas still to be formed. On the basis of the openings 207N, 207M, an anisotropic etch process may be performed so as to first etch through the etch stop layer 204A and into the semiconductor layer 203 to a desired depth, as required for forming isolation trenches. For instance, an etch depth of approximately 250-350 nm may be used, wherein the etch process may be performed on the basis of well-established plasma assisted recipes. Thereafter, the corresponding trenches formed in the semiconductor layer 200 may be filled by an appropriate dielectric material, such as silicon dioxide, wherein also the openings 207N, 207M may be filled. Additionally, anneal processes may be performed in order to density the dielectric fill material, and any excess material may be removed by CMP, thereby providing a planar surface topography, wherein the mask elements 207A, 207B may act as a CMP stop layer.

Figure 2H:
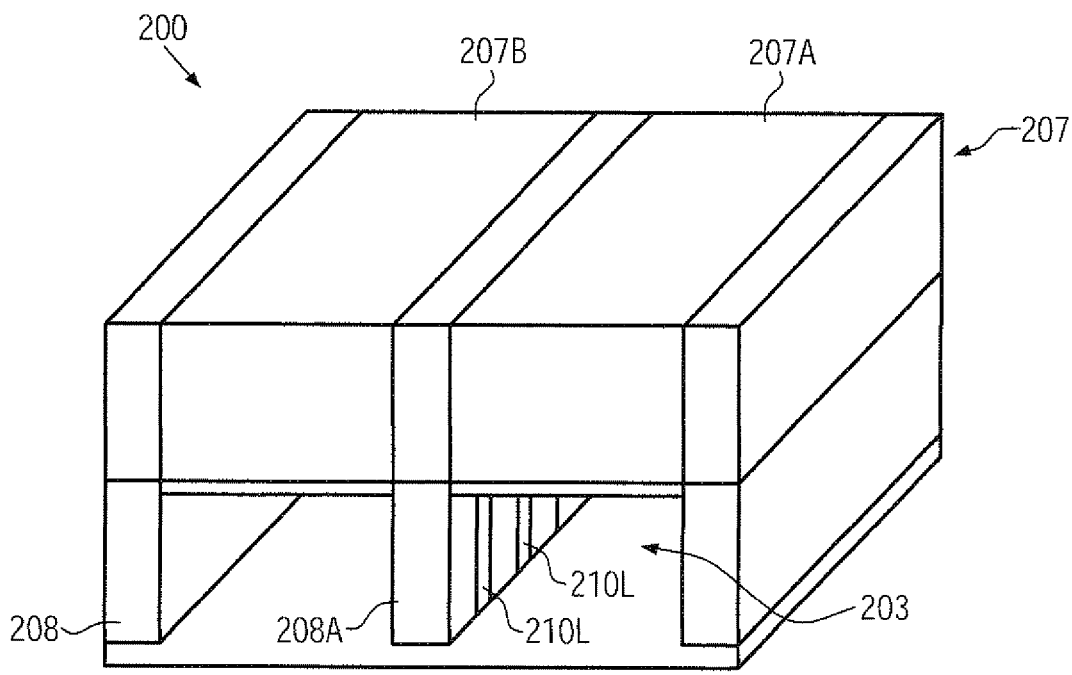

FIG. 2h schematically illustrates the semiconductor device 200 after the end of the above-described process sequence. As illustrated, isolation structures 208 may be formed within the semiconductor layer 203 corresponding to the openings 207M (see FIG. 2g), wherein, in this manufacturing stage, the dielectric material of the isolation structures 208 may extend up to the surface defined by the mask elements 207A, 207B. Similarly, isolation structures 208A may be formed adjacent to respective lower portions 210L of the fins still to be formed, since during the preceding trench etch process performed on the basis of the mask layer 207, also the spacer elements 206 (see FIG. 2e) may act as hard mask within the opening 207N, thereby providing the "deep" fins 210L.

Figure 2I:
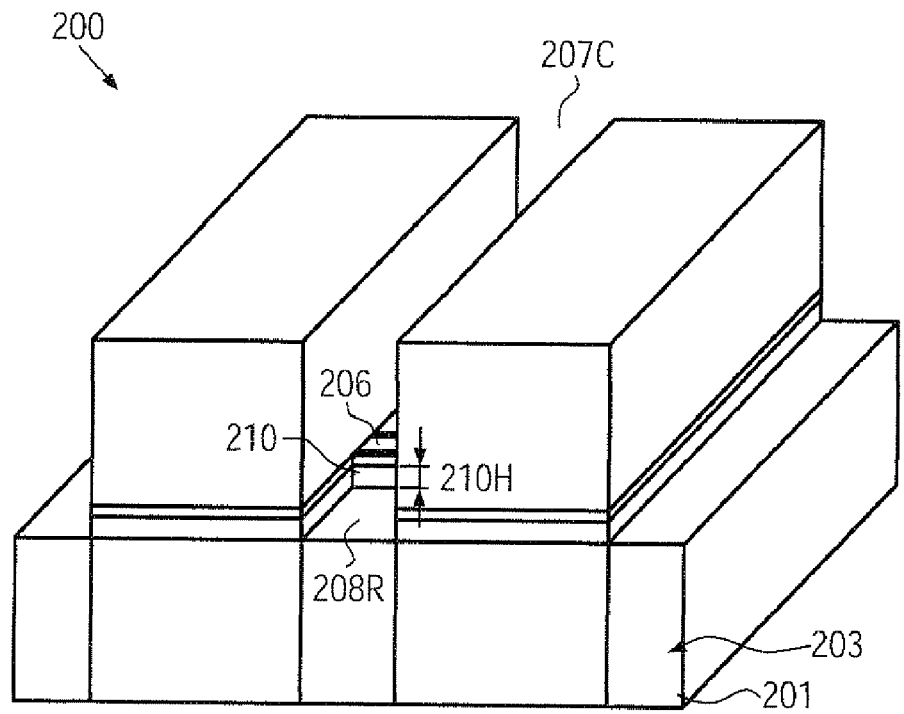

FIG. 2i schematically illustrates the semiconductor device 200 in a further advanced manufacturing stage. As illustrated, the dielectric material formed above the isolation structures 208 and above the isolation structures 208A and the deep fins 210L (see FIG. 2h) may be removed, while also creating a desired recess 208R in the isolation structures 208, 208A in order to actually form fins 210 by defining the degree of recessing of the dielectric materials in the structures 208, 208A. A corresponding controlled material removal may be accomplished by using a highly diluted HF solution wherein, for a given etch rate, a depth of recesses 208R may be adjusted in order to adjust a height 210H of fins 210, which represent upper portions of the deep fins 210L. Moreover, in some illustrative embodiments, the "cap layer," i.e., the spacer elements 206 (see FIG. 2e) may be removed, for instance on the basis of a selective anisotropic etch process in order to expose an upper surface of the fins 210. In this case, the fins 210 may represent the channel region of a tri-gate transistor element.

Figure 2J:
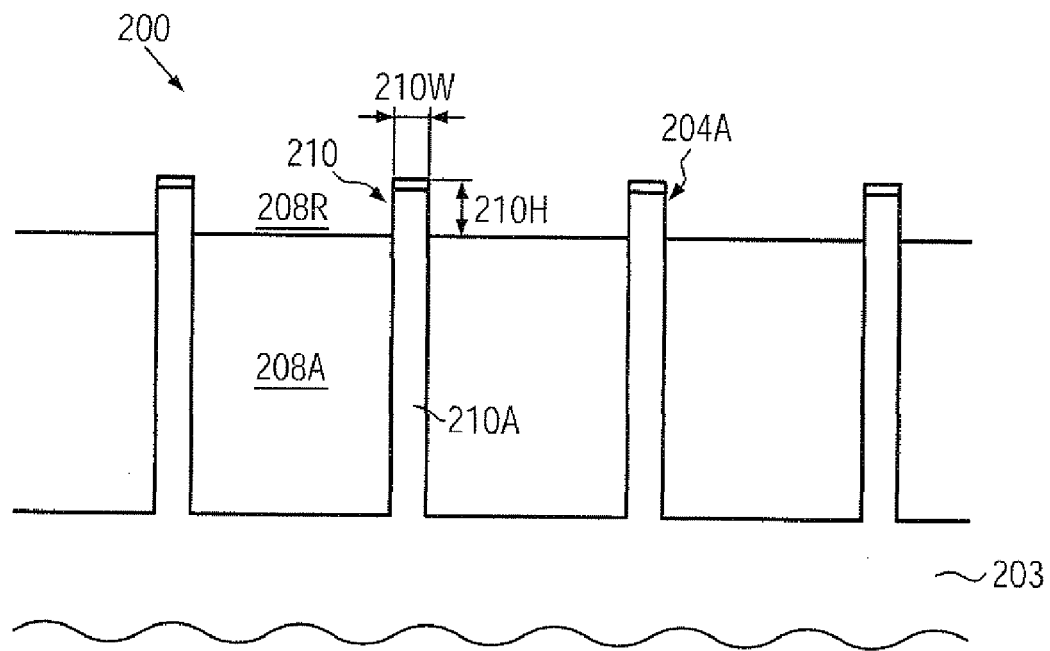
FIG. 2j schematically illustrates a cross-sectional view of the fins prior to performing a well implantation process, according to illustrative embodiments.

FIG. 2j schematically illustrates a cross-sectional view along the opening 207C (see FIG. 2i). As illustrated, the isolation regions 208A are formed within the semiconductor layer 203 so as to extend to a specified depth, as required by the isolation structures 208 (see FIG. 2i), wherein the deep fins 210A separate the respective isolation regions 208A. Furthermore, the recesses 208R define the effective height of the fins 210, which, in some illustrative embodiments, may be selected to be approximately 20-30 nm, depending on the overall device requirements. On the other hand, a width 210W of the fins 210 may be determined by the spacer elements 206 (see FIG. 2i), which may be used as an etch mask during the formation of the recesses 208R. On the other hand, a length of the fins 210, i.e., in FIG. 2j the dimension perpendicular to the drawing planes, may be determined by the width of the opening 207C (see FIG. 2i). Furthermore, in this manufacturing stage, the remains of the etch stop layer 204A may still be provided on the top surface of the fins 210. Consequently, the basic configuration of the transistor elements may be provided in the form of the fins 210, wherein it should be appreciated that, other than in the basic configuration as illustrated in FIG. 2a, the recesses 208R may be provided in the respective isolation regions 208A rather than in the semiconductor material of the layer 203.

Figure 2K:
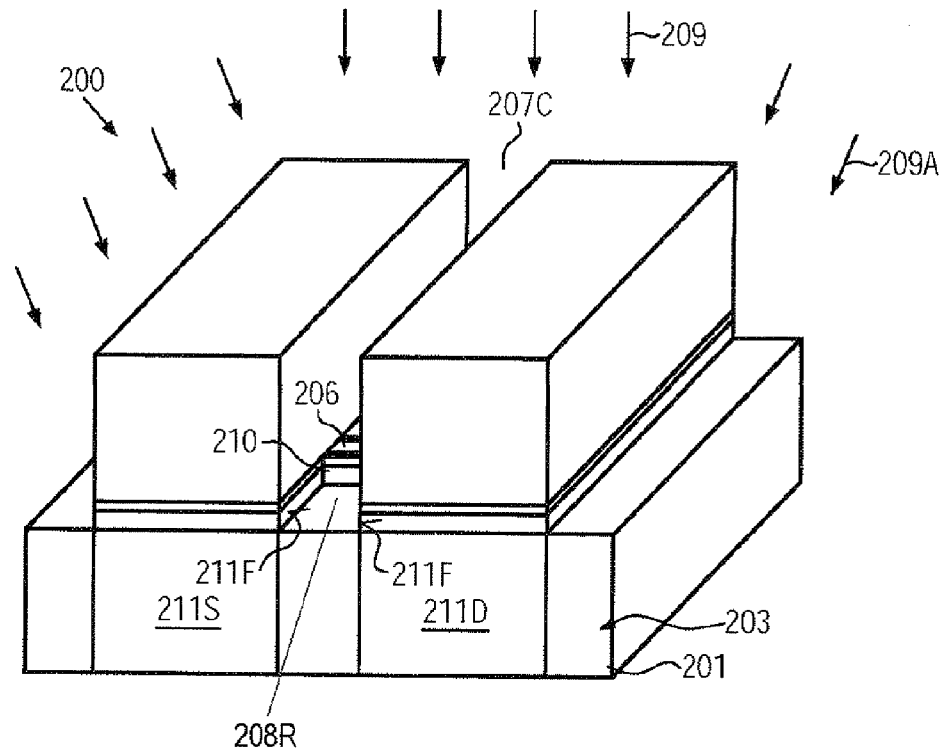
FIGS. 2k-2l schematically illustrate a perspective view and a cross-sectional view, respectively, after a well implantation process.

FIG. 2k schematically illustrates the semiconductor device 200 in a further advanced manufacturing stage in which appropriately designed "planar" process techniques may be applied for completing the tri-gate transistor configuration. In FIG. 2k, an implantation sequence 209 may be performed in order to define the basic transistor characteristics for N-channel transistors and P-channel transistors. For N-channel transistors, a P-type dopant species may be introduced to prevent punch through, which may be accomplished by performing the implantation 209 under a tilt angle of 0°, wherein the other type of transistors may be masked by a resist mask in accordance with well-established lithography techniques. In some illustrative embodiments, the implantation process 209 may include a tilted implantation step 209A, in which the ion beam may be tilted corresponding to the axis of rotation that is substantially parallel to the width direction of the fins 210. Consequently, during the tilted implantation step 209A, the P-type dopant representing a counter dopant for N-channel transistors may be incorporated into exposed sidewalls 211F of the drain and source areas 211S, 211D. On the other hand, significant incorporation of the dopant species into the fins 210 may be suppressed by using a tilt angle of 5-10° and using an appropriate implantation scan regime. Similarly, an N-type dopant species may be introduced into P-channel transistors while masking the corresponding N-channel transistors. The incorporation of the counter dopant species at the exposed sidewall portions 211F of the drain and source areas 211S, 211D may thus provide an increased "isolation area" with respect to a gate dielectric material and a gate electrode material that may be formed within the recesses 208R in a later manufacturing stage so that the increased isolation area may provide a reduced parasitic gate-source/drain capacitance. Consequently, dose and energy of the implantation process 209 and 209A may be appropriately adapted to corresponding source/drain implantation processes to be performed in a later manufacturing stage.

Figure 2L:
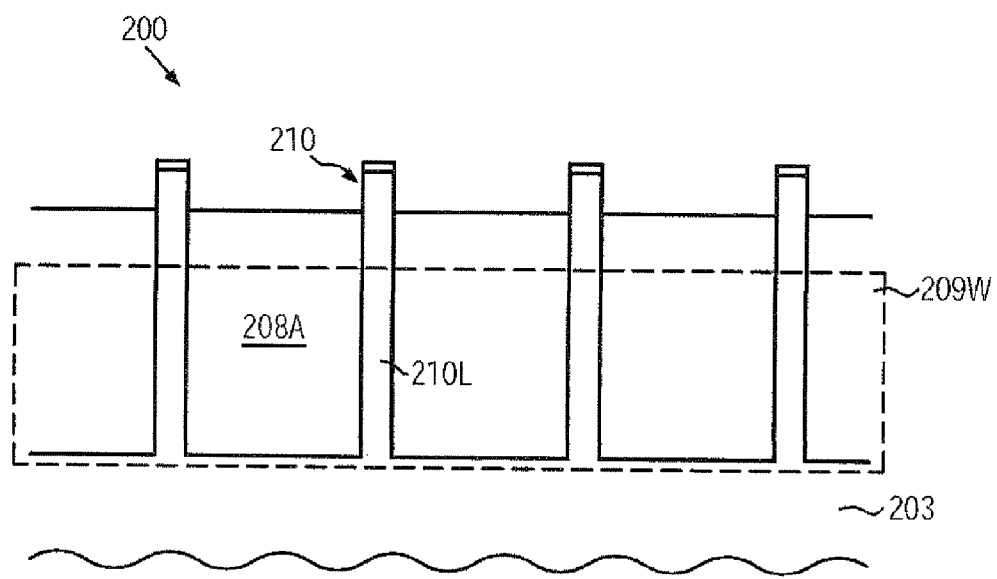

FIG. 2l schematically illustrates a cross-sectional view of the device 200 after the implantation process 209. As illustrated, the well implantation species, indicated as 209W, may be incorporated in the deep fins 210L down to a desired depth in accordance with the device requirements. It should be appreciated that the corresponding well implants 209W may also be introduced into the isolation regions 208A. Next, the device 200 may be prepared for the formation of a gate dielectric material, such as a gate oxide, by performing well-established cleaning processes followed by the deposition and/or oxidation of the dielectric material, such as growing a silicon dioxide material on exposed surface portions of the fins 210. Thereafter, a gate electrode material may be deposited, for instance in the form of polysilicon, on the basis of well-established "planar" process recipes.

Figure 2M:
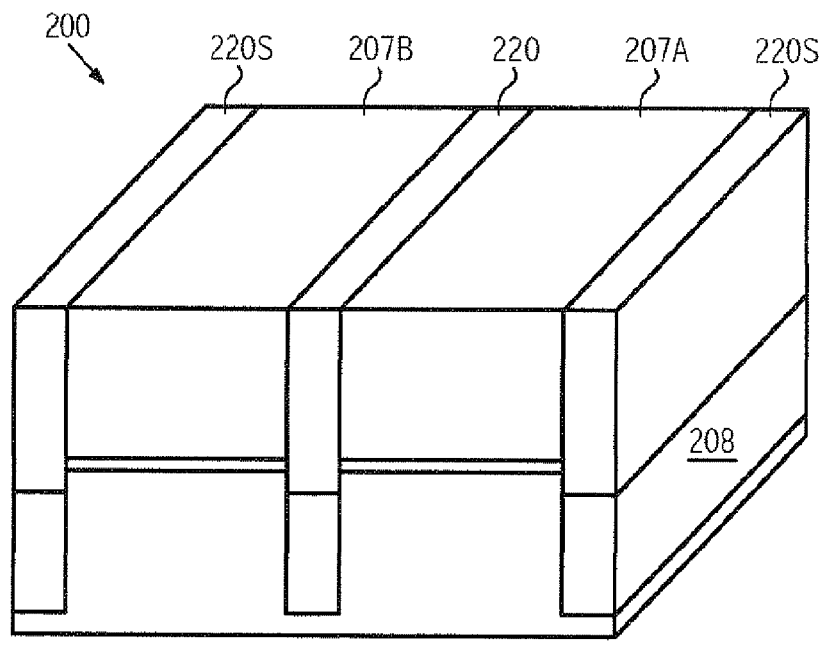
FIGS. 2m-2o schematically illustrate perspective views of the semiconductor device during various manufacturing stages in forming a self-aligned gate electrode structure, according to illustrative embodiments.

FIG. 2m schematically illustrates the semiconductor device 200 after the above-described process sequence and after planarizing the resulting surface topography by removing any excess gate electrode material, for instance on the basis of CMP, and using the mask elements 207A, 207B as a CMP stop material. Consequently, a gate electrode structure 220, which may comprise a plurality of individual gate electrode structures (not shown), may be formed between the mask elements 207A, 207B, while the respective sacrificial "gate electrode structures" 220S may be formed above the isolation structures 208. It should be appreciated that in some illustrative embodiments the gate electrode structure 220 may represent the actual gate electrode in combination with gate dielectrics and consequently appropriate parameters with respect to thickness of the dielectric material and the like may be selected. In other cases, the gate electrode structure 220 as shown in FIG. 2m may be used as a place holder and may be replaced with a sophisticated gate electrode structure on the basis of a metal-containing electrode material and a high-k dielectric material in a later manufacturing stage.

Figure 2N:
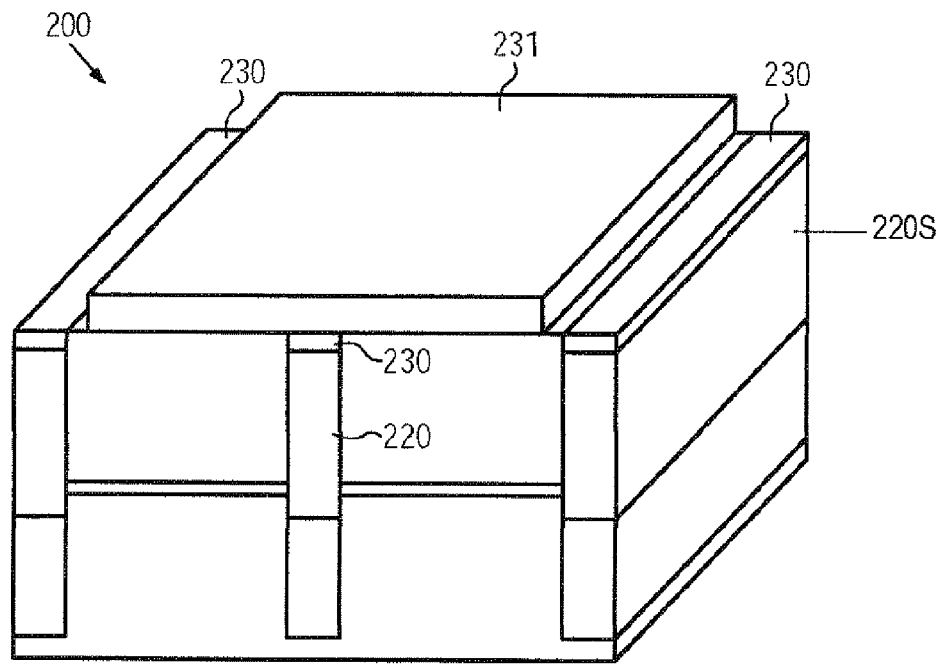

FIG. 2n schematically illustrates the semiconductor device 200 in a further advanced stage in which a mask material 230 may be formed on top of the respective electrode material 220, 220S, for instance in the form of an oxide layer, which may be created on the basis of an oxidation process and the like. Furthermore, an etch mask 231 may be formed above the device 200 in order to protect the exposed portion, in which a gate electrode structure is not to be formed. That is, the etch mask 231 may expose portions corresponding to the sacrificial structures 220S and may cover structure 220. Thereafter, an appropriately designed etch sequence may be performed, for instance by using hydrofluoric acid for removing the exposed mask materials 230 and thereafter a selective plasma assisted etch process may be performed in order to selectively remove the material of the structures 220S, for instance in the form of polysilicon, selectively to nitride and oxide. Also, in this case, an etch strategy may be used that is similar to techniques used in planar transistor configurations. In other cases, a wet chemical etch chemistry may be used, as previously explained.

Figure 2O:
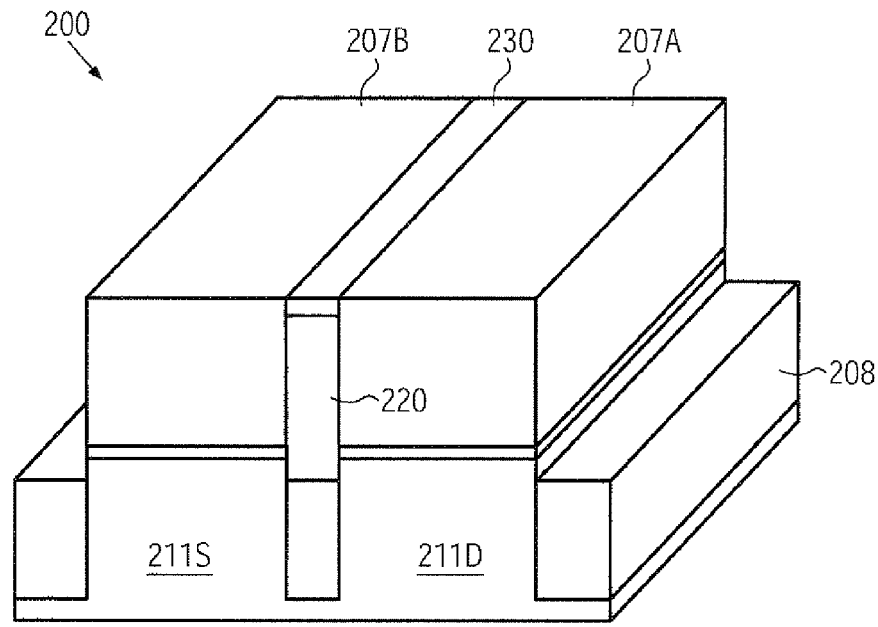

FIG. 2o schematically illustrates the semiconductor device 200 after the above-described process sequence and the removal of the etch mask 231. Hence, the isolation structures 208 are exposed while the mask elements 207A, 207B may still cover the drain and source areas 211S, 211D. Thereafter, the mask elements 207A, 207B may be selectively removed with respect to the mask material 230 and the isolation structures 208. This may be accomplished by using hot phosphoric acid when the mask elements 207A, 207B are comprised of silicon nitride.

Figure 2P:
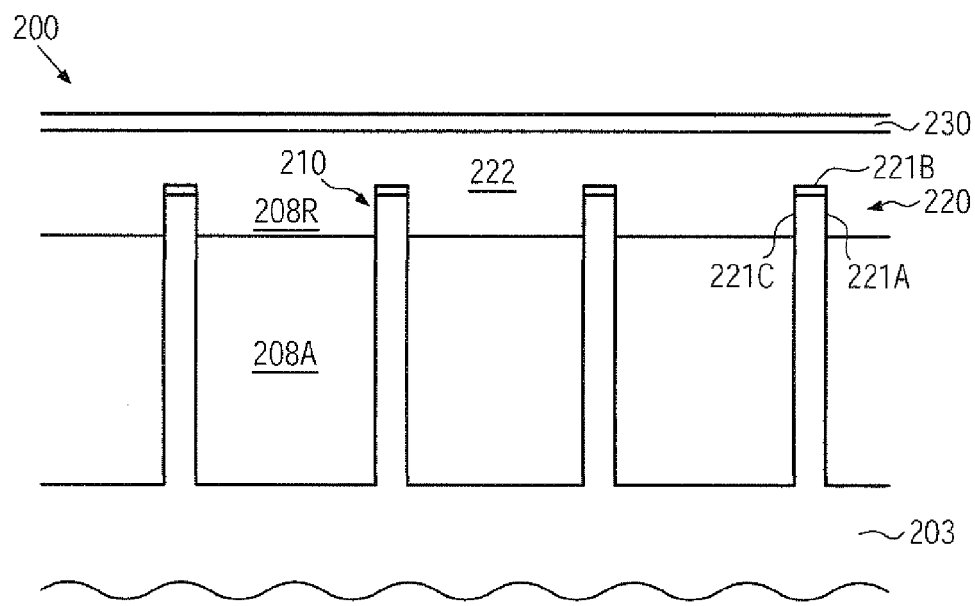
FIG. 2p schematically illustrates a cross-sectional view along the fin direction.

FIG. 2p schematically illustrates a cross-sectional view along the width direction of the fins 210 after removing the mask elements 207A, 207B. Thus, as illustrated, the gate electrode structure 220 is formed in and above the recesses 208R and around and above the fins 210 while respective gate dielectrics 221A, 221B, 221C are provided on surfaces of the fins 210. That is, in the embodiment shown, a tri-gate configuration may be provided in which both sidewalls of the fin 210 may have formed thereon the gate dielectrics 221A, 221C while also a top surface of the fins 210 may have formed thereon the gate dielectric material 221B. Furthermore, the mask material 230 may still be formed on the gate electrode structure 220, that is, a gate electrode material 222 thereof, such as a polysilicon material.

Figure 2R:
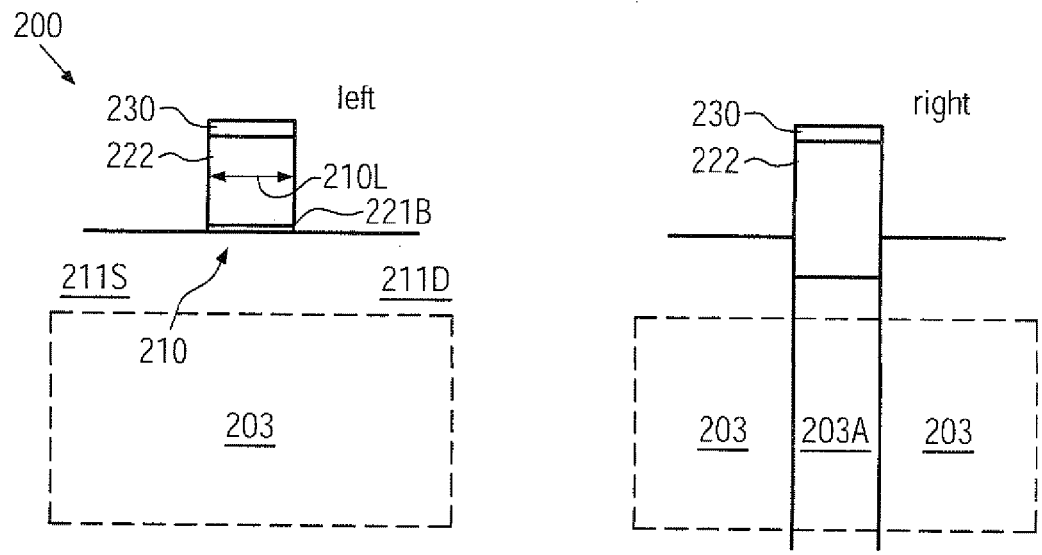
FIGS. 2r-2v schematically illustrate respective cross-sectional views taken along the fin length direction during various manufacturing stages, according to illustrative embodiments.
Figure 2Q:
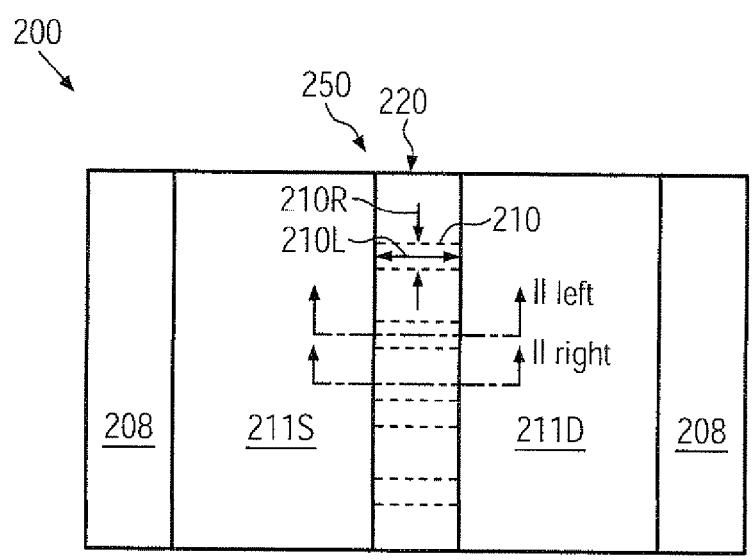
FIG. 2q schematically illustrates a top view of the semiconductor device.

FIG. 2q schematically illustrates a top view of the device 200 as shown in FIG. 2p. Thus, a tri-gate transistor 250 comprising the drain and source areas 211D, 211S and respective channel regions in the form of the fins 210 is laterally enclosed by the isolation structure 208. As illustrated, a length of the channels, i.e., fins 210, and thus of the gate electrode structure 220, may be defined by the previously performed masking regime, thereby also providing self-aligned patterning and positioning of the drain and source areas 211D, 211S and the isolation structure 208.

FIG. 2*r* schematically illustrates on the left-hand side a cross-sectional view along the line II left of FIG. 2*q*, while at the right-hand side a cross-sectional view along the line II right of FIG. 2*q* is illustrated. Thus, as illustrated at the left-hand side of FIG. 2*r*, a gate electrode material 222, in combination with the gate dielectric material 221B formed on top of the fin 210, in combination with the drain and source areas 211D, 211S, may have a very similar configuration compared to planar transistor architectures. On the right-hand side, the respective cross-sectional view of a "gap" area, i.e., the area between adjacent fins 210 as shown in FIG. 2*q*, illustrates the basic concept in which the height of the fins 210 (see left-hand side of FIG. 2*r*) is defined by the degree of recessing of the isolation regions. Consequently, the configuration of the transistor 250 as illustrated at the left-hand side of FIG. 2*r* may enable employment of well-established planar process techniques, thereby providing enhanced efficiency for appropriately adjusting the overall electrical characteristics of the transistor 250 in addition to providing a high silicon volume in the fin 210. For this purpose, well-established implantation techniques, stress-inducing mechanisms and the like may be implemented.

With reference to FIGS. 2*s*-2*v*, respective process techniques may be described in accordance with illustrative embodiments in order to obtain a desired transistor performance for P-channel transistors and N-channel transistors.

Figure 2S:
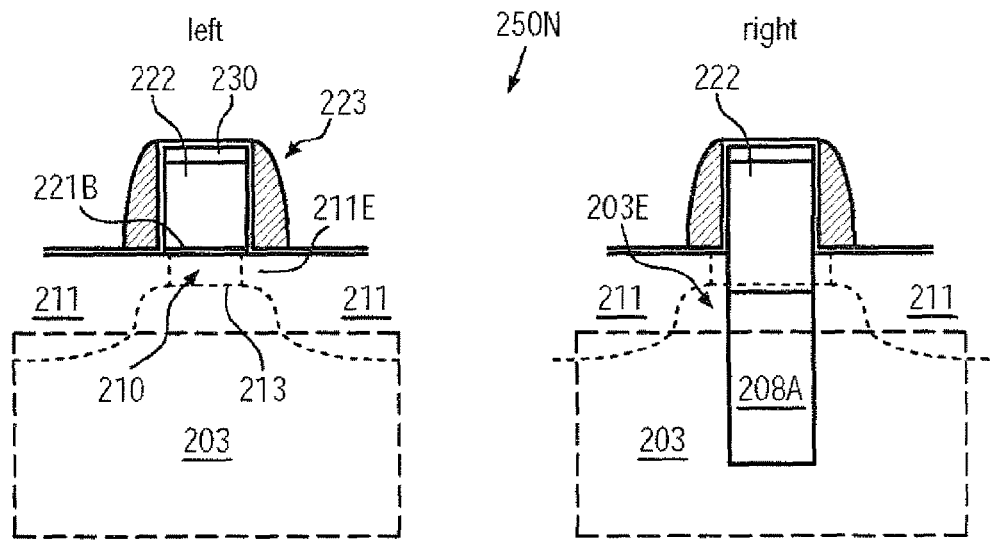

FIG. 2*s* schematically illustrates a cross-sectional view along the section as illustrated in FIG. 2*q*, that is, at the left-hand side of FIG. 2*s*, a section in the length direction of the fins 210 is illustrated, while at the right-hand side, the respective cross-sectional view within a gap area may be illustrated. As shown, a transistor configuration 250N may represent an N-channel transistor and may comprise a sophisticated dopant profile adjacent to the fin 210 within the drain and source areas 211S, 211D (see FIG. 2*r*) to define drain and source regions 211. For instance, an extension region 211E may be provided, similar as in planar transistor configurations, in order to form an appropriate PN junction with the channel region 213, which may be represented by the fin 210. Furthermore, a spacer structure 223 may be formed on sidewalls of the gate electrode material 222 with an appropriate width in order to appropriately define the dopant concentration in the drain and source regions 211.

At the right-hand side of FIG. 2*s*, the corresponding configuration in the gap area is illustrated. In this case, the gate electrode material 222 extends into the recess formed within the isolation region 208A, as previously explained, while, in some illustrative embodiments, an increased offset of the drain and source regions 211 with respect to a gate electrode material 222 may be accomplished due to the counter-doping during the implantation process 209 (see FIG. 2*k*), in which exposed sidewall portions of the semiconductor layer 203 may receive a dopant species corresponding to the well dopant species, thereby providing a "withdrawn" PN junction with respect to the drain and source regions 211, so that the parasitic capacitance between the drain and source regions 211 and the gate electrode material 222 is reduced due to the increased offset.

The transistor configuration 250N as illustrated in FIG. 2*s* may be accomplished by performing appropriate implantation processes, while masking P-channel transistors, for instance by using halo implantation processes in order to appropriately increase the well dopant concentration at the area between the fin 210 and the drain and source regions 211 in accordance with well-established recipes. Thereafter, the extension region 211E may be formed, for instance by using an appropriately designed offset spacer of the structure 223, and thereafter the spacer structure 223 may be formed with an appropriate width so as to act as an implantation mask during the subsequent implantation of the deep drain and source areas in order to establish the desired concentration profile. It should be appreciated that the spacer structure 223 may comprise a plurality of individual spacer elements, which may be formed after a corresponding implantation process.

Figure 2T:
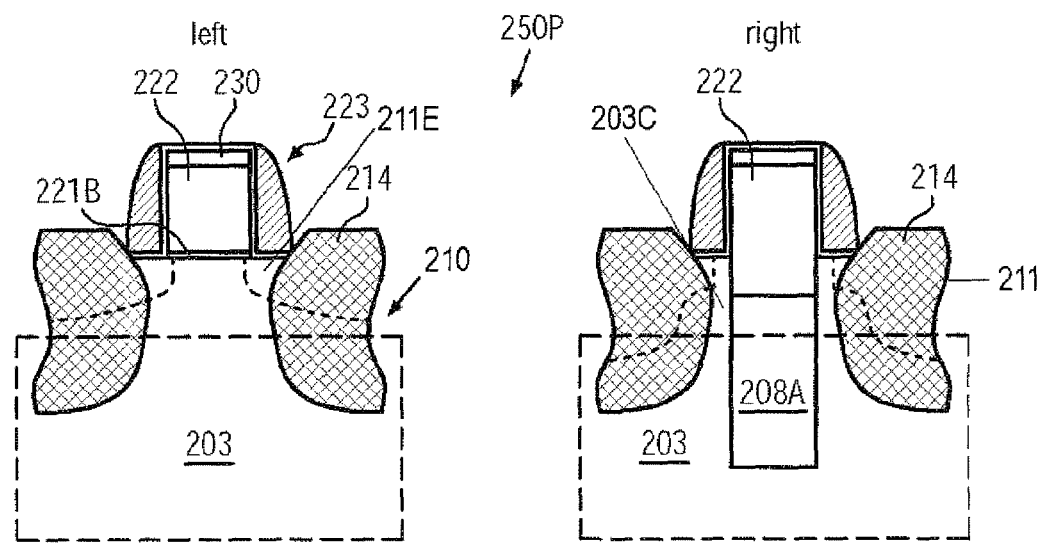

FIG. 2*t* schematically illustrates a corresponding transistor configuration 250P for a P-channel transistor according to some illustrative embodiments. As illustrated, the transistor 250P may comprise a strain-inducing material 214, for instance in the form of a silicon/germanium alloy and the like, which may be embedded into the material 203 adjacent to the fin 210 so as to establish a compressive strain component along the current flow direction within the fin 210, thereby enhancing hole mobility therein. The strain-inducing material 214 may be formed by etching a cavity into the semiconductor layer 203 on the basis of, for instance, the spacer structure 223 or any other appropriate mask material, followed by a selective epitaxial growth process for growing the desired semiconductor alloy 214, which may also be provided in the form of a highly doped material, thereby possibly avoiding one implantation process for forming the deep drain and source regions. As illustrated, the strain-inducing material 214 may be provided with a certain degree of excess height, if considered appropriate. Furthermore, respective extension regions 211E may be formed so as to connect to the channel region, i.e., the fin 210.

On the right-hand side of FIG. 2*t*, the corresponding configuration is illustrated for the gap region. As illustrated, also in this case, an increased offset between the gate electrode material 222 and the drain and source regions 211 may also be obtained due to the counter doped region 203C, which may have been formed during the implantation process 209, including the tilted implantation 209A (see FIG. 2*k*).

It should be appreciated that respective strain-inducing mechanisms may also be provided in the N-channel transistor 250N, for instance in the form of an appropriate semiconductor alloy, such as silicon/carbon, or by applying respective stress memorization techniques during the formation of the drain and source regions 211. That is, at least a portion of the drain and source regions 211 may be re-grown in a substantially amorphized state on the basis of an overlying rigid material layer, such as a silicon nitride layer, in order to create the re-grown portion of the drain and source regions in a strained state. In other illustrative embodiments, after forming the drain and source regions 211, these regions may be recessed in order to provide advantages with respect to a subsequent silicidation process, possibly in combination with a stress-inducing material, such as a tensile stressed contact material and the like.

After the incorporation of the dopant species for forming the drain and source regions 211 of the transistors 250N, 250P, a final anneal process may be performed to activate the dopants and re-crystallize implantation-induced damage, thereby also tuning the finally desired dopant profile.

Figure 2U:
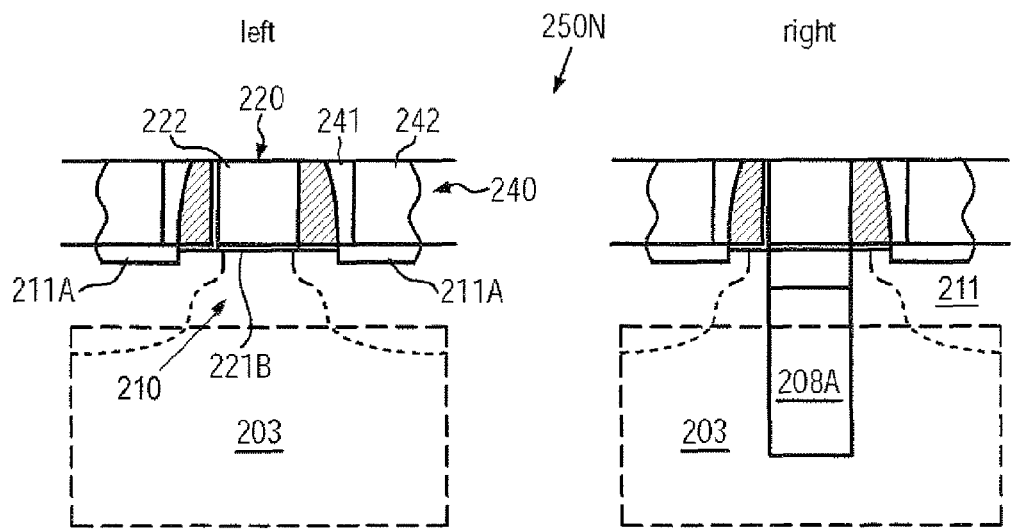

FIG. 2*u* schematically illustrates the transistor configuration 250N in a further advanced manufacturing stage. As shown, a contact structure 240 may be provided and may comprise an interlayer dielectric material 241, such as silicon dioxide and the like, in which one or more contact elements 242 may be embedded. The contact elements 242 may be comprised of any appropriate metal, such as tungsten, copper, aluminum and the like, possibly in combination with appropriate conductive barrier materials, depending on the overall process and device requirements. In some illustrative embodiments, the contact elements 242 may comprise a metal-containing material having a high internal tensile stress level, which may, for instance, be accomplished on the basis of well-established deposition recipes for forming a tungsten material, thereby providing a desired tensile stress level in the channel or fin 210.

The right-hand side of FIG. 2u schematically illustrates the configuration of the contact level 240 in the gap area. As illustrated, also in this area, one or more contact elements 242 or a continuously extending contact element may be provided to reduce the overall contact resistance to the drain and source regions 211.

Typically, the contact level 240 may be formed on the basis of well-established "planar" process techniques, for instance by depositing a refractory metal and initiating a chemical reaction during a heat treatment with a subsequent deposition of an appropriate dielectric material, such as silicon dioxide, which may be planarized by CMP and the like. Thereafter, the dielectric material may be patterned by lithography and anisotropic etch techniques in order to obtain respective contact openings, which may then be filled with the desired contact metal, such as tungsten and the like.

Figure 2V:
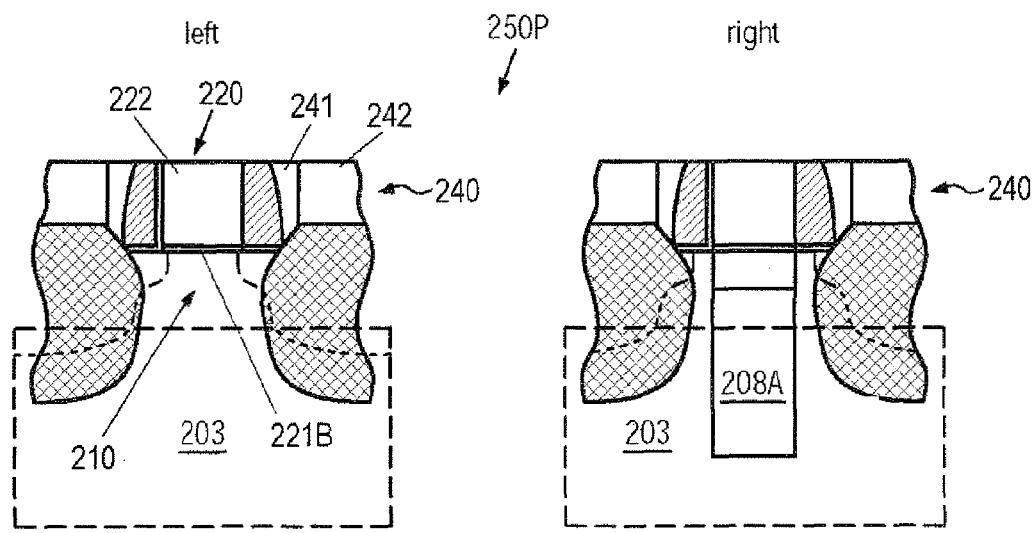

FIG. 2v schematically illustrates the contact structure 240 of the P-channel transistor 250P, which may have a similar configuration as described above.

Next, a metallization system may be formed, for instance by providing a dielectric material, for instance in the form of a low-k dielectric material, and forming therein vias which may connect to metal lines of a first metallization layer.

In some illustrative embodiments, the gate electrode structure 220 may be replaced by a sophisticated structure including a metal-containing electrode material in combination with a high-k dielectric material. For this purpose, prior to forming the contact elements 242 within the dielectric material 241, the gate electrode material 222 may be selectively removed, for instance on the basis of TMAH, which may efficiently remove silicon selectively to silicon dioxide and silicon nitride. In other cases, other selective etch recipes, such as plasma assisted processes on the basis of HBr, may be used, while, in other illustrative embodiments, any selective etch process may be used, depending on the material compositions of the gate electrode structure 220 and the surrounding dielectric materials. Thereafter, the gate dielectrics, such as the dielectric material 221B, may be removed from the exposed sidewall portions of the fin 210. This may be accomplished by using HF, if the gate dielectric may be substantially comprised of silicon dioxide.

Figure 2W:
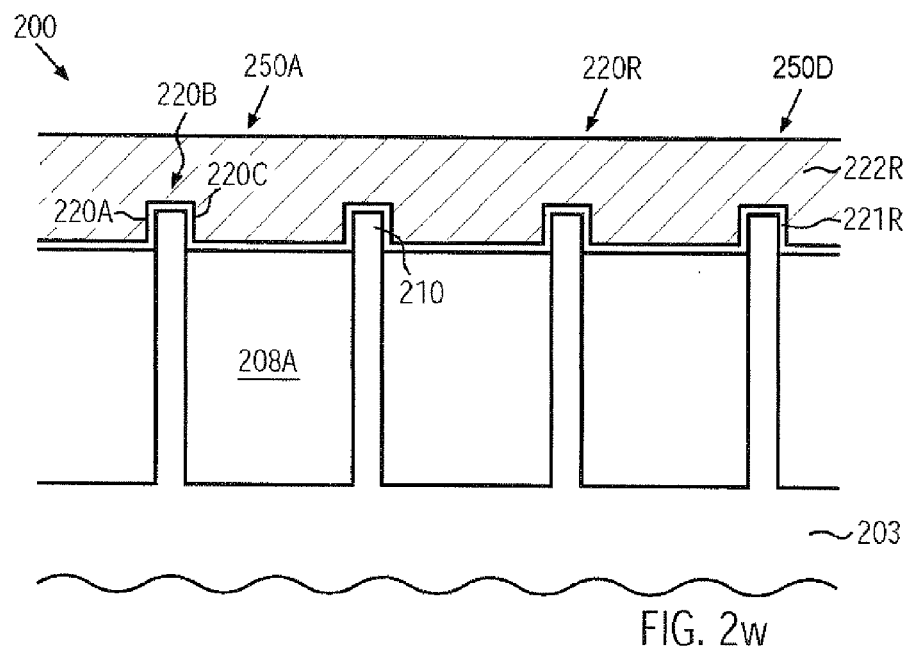
FIG. 2w schematically illustrates a cross-sectional view along the fin width direction with a metal replacement gate and a high-k dielectric material, according to illustrative embodiments.

FIG. 2w schematically illustrates a cross-sectional view along the fin width direction after the above-described process sequence and in a further advanced manufacturing stage. As illustrated, the device 200 may comprise a replacement gate electrode structure 220R, which may comprise a metal-containing material 222R, such as titanium nitride and the like, in combination with a high-k dielectric material 221R, which may cover sidewall portions and the top surface of the fins 210. Thus, a tri-gate configuration including respective gate electrode structures 220A, 220C formed on sidewalls of the fin 210 and a gate electrode structure 220B formed on top of the fin 210 may be provided, thereby also providing a plurality of transistor cells 250A . . . 250D. Consequently, each of the transistor cells 250A . . . 250D or the combination thereof represents a tri-gate transistor providing a specified threshold voltage for each conductivity type based on the appropriately selected metal material 222R and the manufacturing sequence for forming the corresponding drain and source regions. If more threshold voltages are required, multiple gate metals may be integrated with different work functions in order to create a moderately large shift in threshold voltage, while, in other cases, appropriately designed halo implantations may be performed in order to create slight shifts of the threshold voltage.

Consequently, an efficient three-dimensional transistor configuration may be obtained with enhanced transistor performance due to reduced series resistance and the usage of well-established and efficient manufacturing techniques and mechanisms as are well established for planar transistor configurations. Moreover, a self-aligned configuration of the drain and source regions, channel regions or fins 210 and respective isolation structures may be accomplished on the basis of the previously described masking regime. Furthermore, compared to conventional strategies, a complex epitaxial growth process for providing continuous drain and source regions for a plurality of transistors may be avoided, thereby also contributing to enhanced overall process efficiency.

Figure 3A:
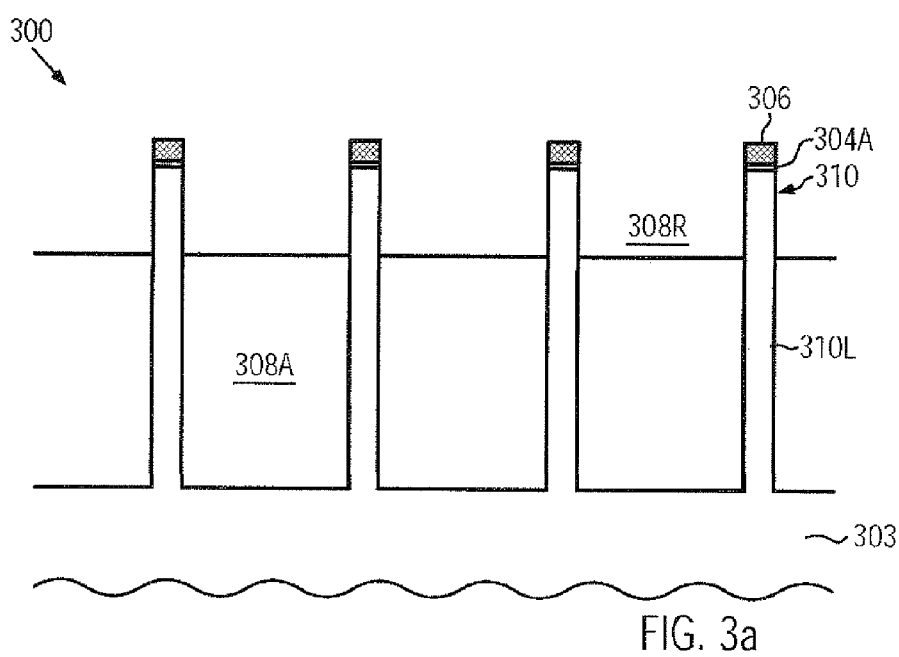
FIGS. 3a-3c schematically illustrate cross-sectional views and perspective views, respectively, of a semiconductor device including a plurality of double channel transistor cells, according to still other illustrative embodiments.
Figure 3B:
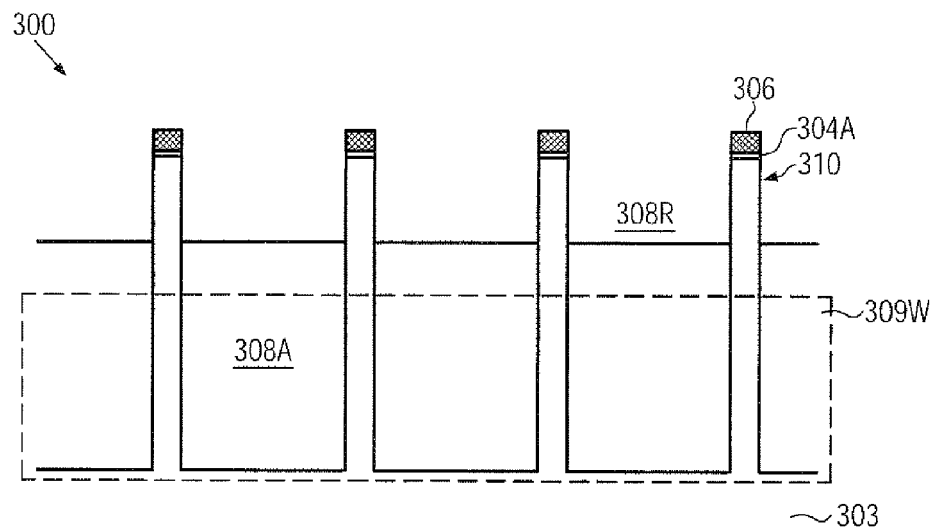
Figure 3C:
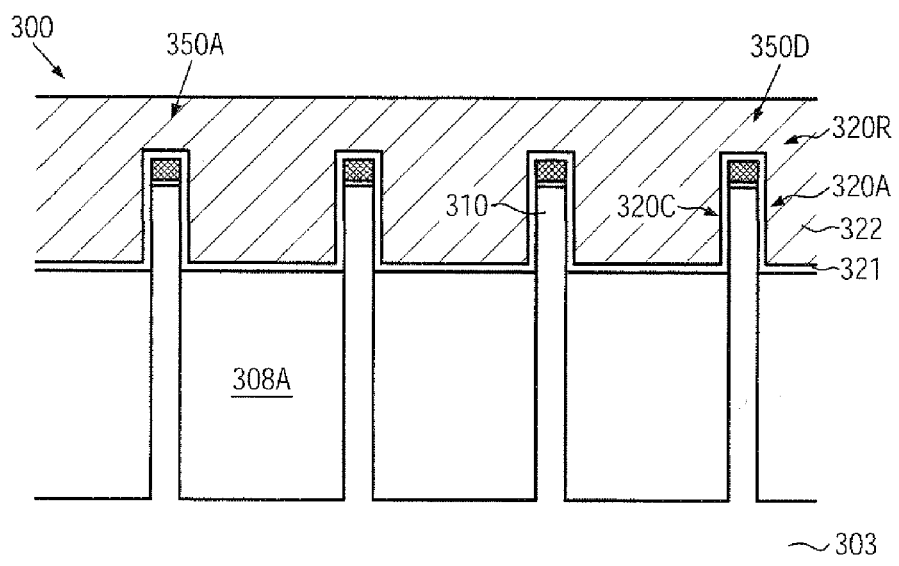

With reference to FIGS. 3a-3c, a corresponding process sequence for forming a double gate or FinFET transistor configuration may be described in more detail. Generally, a very similar process sequence may be used, as previously described for the tri-gate transistor configuration 250, wherein, however, a moderately thick cap layer may be provided on top of the fin, which may be accomplished by not removing a corresponding hard mask used for patterning the fins in the semiconductor material. Thus, the corresponding gate electrode material may be isolated from the top of the fin by a thick insulator and current flow takes place on the side surface of the fin only. Generally, for the same effective transistor width compared to a tri-gate configuration, the FinFET requires a fin of increased height, while the width thereof may have to be reduced since the gate electrode provided above the top surface may have substantially no effect on the depletion within the fin.

FIG. 3a schematically illustrates a cross-sectional view of a semiconductor device 300 which may have a very similar configuration compared to the semiconductor device 200 as shown in FIG. 2j. For this reason, similar components are denoted by the same reference numbers except for the first digit, which is a "3" instead of a "2," Hence, the device 300 may comprise a semiconductor layer 303 including isolation regions 308A, separated by respective deep fins 310L, on which are provided fins 310, which are capped by cap elements 306, such as silicon nitride elements, in combination with etch stop material 304A, for instance in the form of silicon dioxide. As explained above, compared to the fins 210, the fins 310 may have an increased height of approximately 30-40 nm, while a width thereof may be reduced and may range from approximately 10-15 nm.

The semiconductor device 300 may be formed on the basis of the same manufacturing techniques as previously described with reference to the device 200 according to the description corresponding to FIGS. 2b-2j. Hence, a respective explanation will be omitted. It should be appreciated, however, that contrary to the process regime as described with reference to FIGS. 2b-2j, the cap elements 306 may represent corresponding spacer elements previously formed as a hard mask for patterning the fins 310, as is also explained with reference to the spacer elements 206 (for example see FIG. 2g). It should also be appreciated that the cap elements 306 may be formed with a reduced width so as to comply with the requirement for the fins 310. Similarly, the process for forming recesses 308R within the isolation region 308A, as is also explained with reference to FIG. 2i when referring to the semiconductor device 200, may be appropriately adapted in order to obtain the desired increased height of the fins 310.

FIG. 3b schematically illustrates a cross-sectional view of the device 300 with basic well implant species 309W, which may be implanted as previously explained with reference to FIGS. 2k-2l when referring to the semiconductor device 200. Thereafter, the further processing may be continued, as previously described with reference to the device 200. That is, respective gate electrode structures or dummy gate electrode structures may be formed by providing an appropriate dielectric material and depositing a gate electrode material. Thereafter, the drain and source areas may be exposed and the corresponding "planar" manufacturing processes may be applied in order to complete the basic transistor configurations. Furthermore, if required, the gate electrode structure may be replaced by a high-k dielectric material in combination with a metal-containing electrode material, as previously described.

FIG. 3c schematically illustrates the semiconductor device 300 in an advanced manufacturing stage in which a replacement gate electrode structure 320R may be provided around the fins 310, in combination with a high-k dielectric material 321. Consequently, a double gate configuration may be established for each of the transistor cells 350A . . . 350D, that is, a first gate electrode structure 320A may be provided on one sidewall of the fin 310, and a second gate electrode structure 320C may be provided on the opposite sidewall. On the other hand, a top surface of the fin 310 may still be covered by the cap element 306 in combination with the etch stop layer 304A (see FIG. 3b).

As a result, the present disclosure provides enhanced three-dimensional transistor configurations, that is, double gate and tri-gate transistor configurations, in which the fins of the transistors may be provided on the basis of a bulk semiconductor material, thereby providing increased semiconductor volume, while at the same time the continuous drain and source areas may connect to the channel regions of the fin without requiring an intermediate fin portion that may act as a high resistance drain and source portion, as is typically the case in conventional FinFET and tri-gate transistor architectures. Furthermore, the channel area, i.e., the fins and thus the gate electrode structure, the drain and source regions and the isolation structure, may be provided on the basis of a masking regime that enables a self-aligned process sequence, while avoiding complex selective epitaxial growth processes for providing the continuous drain and source areas. Furthermore, after forming the fins, well-established and efficient process techniques from two-dimensional or planar transistor manufacturing processes may be applied, possibly including efficient strain-inducing mechanisms, so that, in addition to providing increased semiconductor volume in the fins and avoiding high resistance drain and source portions in the fins, further performance enhancing mechanisms may be advantageously applied.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer stack above a semiconductor layer of a semiconductor device, said layer stack comprising an etch stop layer formed above said semiconductor layer and a first mask layer formed above said etch stop layer;
   patterning said first mask layer so as to obtain a mask feature;
   forming a spacer element on sidewalls of said mask feature;
   removing said mask feature selectively to said sidewall spacer element;
   providing a second mask layer having a first opening exposing a portion of said sidewall spacer element so as to define a channel area and drain and source areas and having a second opening so as to define a position and lateral size of an isolation structure;
   forming trenches in said semiconductor layer by using said sidewall spacer element and said second mask layer as an etch mask so as to form a fin in said semiconductor layer, said fin corresponding to said channel area;
   forming a gate electrode structure at least on sidewalls of said fin; and
   forming drain and source regions in said drain and source areas, said drain and source regions connecting to said fin.

2. The method of claim 1, wherein forming said trenches comprises forming said trenches on the basis of said first and second openings.

3. The method of claim 2, further comprising filling said trenches and said first and second openings with a dielectric material.

4. The method of claim 3, further comprising recessing said dielectric material in said openings below a height level corresponding to a surface of said semiconductor layer so as to adjust an effective height of said fin.

5. The method of claim 4, further comprising performing a well implantation process on the basis of said second mask layer after recessing said dielectric material.

6. The method of claim 5, further comprising performing a counter-doping implantation process by using a tilt angle to introduce counter doping dopant species with respect to said drain and source regions at exposed sidewall areas of said semiconductor layer.

7. The method of claim 1, wherein forming said gate electrode structure comprises forming a dielectric material on exposed sidewall areas of said fin within said first opening of said second mask layer and depositing at least one of a place holder material and a gate electrode material in said first opening prior to forming said drain and source regions.

8. The method of claim 7, further comprising removing said second mask layer and forming said drain and source regions while using said at least one of a place holder material and a gate electrode material as an implantation mask.

9. The method of claim 8, wherein forming said drain and source regions comprises performing a first implantation process, forming a second sidewall spacer element on sidewalls of said at least one of a place holder material and a gate electrode material and performing a second implantation process using said second sidewall spacer element as implantation mask.

10. The method of claim 7, further comprising replacing said at least one of a place holder material and a gate electrode material by a metal-containing material.

11. The method of claim 10, further comprising removing said dielectric material from said exposed sidewall portions and depositing a high-k dielectric material.

12. The method of claim 11, further comprising exposing a top surface of said fin and depositing said high-k dielectric material on said exposed top surface.

13. The method of claim 11, further comprising forming a cap layer on a top surface of said fin and depositing said high-k dielectric material on said cap layer.

14. The method of claim 1, further comprising forming a cavity in said semiconductor layer in said drain and source areas prior to forming said drain and source regions and filling said cavities with a strain-inducing semiconductor material.

15. A method of forming a transistor, the method comprising:
forming a mask feature above a semiconductor layer, said mask feature defining a lateral dimension of a fin to be formed in said semiconductor layer;
forming a mask layer having a first opening and a second opening, said first opening defining a length of said fin, said second opening defining a lateral size and position of an isolation structure;
forming said fin and an isolation trench in said semiconductor layer in a common etch process by using said mask layer as an etch mask;
forming a first gate electrode structure on a portion of a first sidewall of said fin and forming a second gate electrode structure on a portion of a second sidewall of said fin; and
forming drain and source regions in said semiconductor layer adjacent to end portions of said fin.

16. The method of claim 15, wherein forming said mask feature comprises forming an etch stop layer on said semiconductor layer, forming a sacrificial mask layer on said etch stop layer, patterning said sacrificial mask layer to form a line feature, forming a spacer element on sidewalls of said line feature and selectively removing said line feature.

17. The method of claim 15, wherein forming said first and second gate electrodes comprises filling said first and second openings with a place holder material after forming said fin and replacing said place holder material with a high-k dielectric material and a metal-containing electrode material after forming said drain and source regions.

18. The method of claim 15, wherein a third gate electrode is formed on a top surface of said fin.

19. The method of claim 16, wherein said etch stop layer is comprised of silicon dioxide and said sacrificial mask material is comprised of silicon.

20. A method, comprising:
forming a layer stack above a semiconductor layer of a semiconductor device, said layer stack comprising an etch stop layer formed above said semiconductor layer and a first mask layer formed above said etch stop layer;
patterning said first mask layer so as to obtain a mask feature;
forming a spacer element on sidewalls of said mask feature;
removing said mask feature selectively to said sidewall spacer element;
providing a second mask layer having a first opening exposing a portion of said sidewall spacer element so as to define a channel area and drain and source areas;
forming trenches in said semiconductor layer by using said sidewall spacer element and said second mask layer as an etch mask so as to form a fin in said semiconductor layer, said fin corresponding to said channel area;
forming a gate electrode structure at least on sidewalls of said fin; and
forming drain and source regions in said drain and source areas, said drain and source regions connecting to said fin,
wherein forming said gate electrode structure comprises forming a dielectric material on exposed sidewall areas of said fin within said first opening of said second mask layer and depositing at least one of a place holder material and a gate electrode material in said first opening prior to forming said drain and source regions.

21. The method of claim 20, further comprising removing said second mask layer and forming said drain and source regions while using said at least one of a place holder material and a gate electrode material as an implantation mask.

22. The method of claim 21, wherein forming said drain and source regions comprises performing a first implantation process, forming a second sidewall spacer element on sidewalls of said at least one of a place holder material and a gate electrode material and performing a second implantation process using said second sidewall spacer element as implantation mask.

23. The method of claim 20, further comprising replacing said at least one of a place holder material and a gate electrode material by a metal-containing material.

24. The method of claim 23, further comprising removing said dielectric material from said exposed sidewall portions and depositing a high-k dielectric material.

25. The method of claim 24, further comprising exposing a top surface of said fin and depositing said high-k dielectric material on said exposed top surface.

26. The method of claim 24, further comprising forming a cap layer on a top surface of said fin and depositing said high-k dielectric material on said cap layer.

27. The method of claim 20, further comprising forming a cavity in said semiconductor layer in said drain and source areas prior to forming said drain and source regions and filling said cavities with a strain-inducing semiconductor material.

28. A method, comprising:
forming a layer stack above a semiconductor layer of a semiconductor device, said layer stack comprising an etch stop layer formed above said semiconductor layer and a first mask layer formed above said etch stop layer;
patterning said first mask layer so as to obtain a mask feature;
forming a spacer element on sidewalls of said mask feature;
removing said mask feature selectively to said sidewall spacer element;
providing a second mask layer having a first opening exposing a portion of said sidewall spacer element so as to define a channel area and drain and source areas;
forming trenches in said semiconductor layer by using said sidewall spacer element and said second mask layer as an etch mask so as to form a fin in said semiconductor layer, said fin corresponding to said channel area;
forming a gate electrode structure at least on sidewalls of said fin;
forming drain and source regions in said drain and source areas, said drain and source regions connecting to said fin; and
forming a cavity in said semiconductor layer in said drain and source areas prior to forming said drain and source regions and filling said cavities with a strain-inducing semiconductor material.

* * * * *